United States Patent
Ota (10) Patent No.: US 7,777,797 B2
(45) Date of Patent: Aug. 17, 2010

(54) SOLID-STATE IMAGING DEVICE IMPROVING S/N RATIO OF SIGNALS OBTAINED BY ELECTRON MULTIPLICATION AND A METHOD OF DRIVING THE SAME

(75) Inventor: Motoari Ota, Asaka (JP)

(73) Assignee: Fujifilm Corporation, Tokyo (JP)

( * ) Notice: Subject to any disclaimer, the term of this patent is extended or adjusted under 35 U.S.C. 154(b) by 368 days.

(21) Appl. No.: 11/896,727

(22) Filed: Sep. 5, 2007

(65) Prior Publication Data
US 2008/0068479 A1 Mar. 20, 2008

(30) Foreign Application Priority Data
Sep. 15, 2006 (JP) ............... 2006-251236

(51) Int. Cl.
H04N 5/335 (2006.01)
H04N 5/217 (2006.01)

(52) U.S. Cl. ........................ 348/301; 348/241

(58) Field of Classification Search ................ 348/241, 348/243, 300, 301, 302, 308, 311, 294
See application file for complete search history.

(56) References Cited

U.S. PATENT DOCUMENTS 5,337,340 A * 8/1994 Hynecek ...................... 377/60
5,401,952 A * 3/1995 Sugawa .................... 250/208.1
7,291,821 B2 * 11/2007 Robbins ................... 250/208.1
7,485,840 B2 * 2/2009 Lazovsky ................. 250/214.1
2004/0150737 A1 * 8/2004 Pool et al. .................... 348/311
2006/0170009 A1 * 8/2006 Kitano et al. ................ 257/236
2006/0186363 A1 * 8/2006 Hazelwood et al. .......... 250/580
2006/0231738 A1 * 10/2006 Robbins ................... 250/208.1
2008/0303933 A1 * 12/2008 Kondo et al. ................ 348/311

FOREIGN PATENT DOCUMENTS

JP 8-340099 A 12/1996
JP 2002-290836 A 10/2002

* cited by examiner

*Primary Examiner*—Jason Chan
*Assistant Examiner*—Nicholas G Giles
(74) *Attorney, Agent, or Firm*—Birch, Stewart, Kolasch & Birch, LLP (57) ABSTRACT

A solid-state imaging device includes photo-sensitive cells for converting incident light to signal charges, and a transfer path for transferring, in response to a drive signal fed through a transfer electrode, the signal charges read out from the photo-sensitive cells. The solid-state imaging device outputs electrical signals corresponding to the signal charges thus transferred. The transfer electrode is divided into a first transfer electrode for transferring the signal charges and a second transfer electrode for reading out the signal charges from the photo-sensitive cells.

9 Claims, 11 Drawing Sheets

SOLID-STATE IMAGING DEVICE IMPROVING S/N RATIO OF SIGNALS OBTAINED BY ELECTRON MULTIPLICATION AND A METHOD OF DRIVING THE SAME

BACKGROUND OF THE INVENTION

1. Field of the Invention

The present invention relates to a solid-state imaging device, and more particularly to an electron multiplication type of solid-state imaging device for multiplying electrons to make signal sensitivity higher. The present invention also relates to a drive method therefor, and more particularly to a method of multiplying signal charges to read out high-quality signals.

2. Description of the Background Art

Electron multiplication in solid-state imaging devices has been proposed by, for example, Japanese patent laid-open publication No. 340099/1996, which discloses that impact ionization, which is an electron multiplication phenomenon, occurs at the read-out gate of a charge-coupled device (CCD). If impact ionization amplifies dark current, the dark current thus amplified will develop as a so-called white mark on an image. The '099 publication is aimed at preventing impact ionization from occurring. In order to suppress the occurrence of such white marks, the solid-state imaging device adjusts an impurity concentration in a semiconductor established between the charge storage and the read-out gate so that the strength of an electric field occurring on the read-out gate is alleviated, and consequently, electron multiplication is suppressed.

Another Japanese patent laid-open publication, No. 2002-290836, discloses an application of electron multiplication to a frame transfer type of CCD. The JP publication '836 has an amplifier for causing impact ionization to occur. Thus, the solid-state imaging device of the '836 publication lets electron multiplication to occur to improve sensitivity.

In solid-state imaging devices, if only signal charges could be multiplied, the signal-to-noise (S/N) ratio could be improved. However, in the case of aforementioned '099 publication, as clear from its purpose described above, the solid-state imaging device suppresses the occurrence of impact ionization per se. From the viewpoint of improving a signal-to-noise ratio, this suppression is negative use of electron multiplication.

In the aforementioned '836 publication, signal charges are multiplied after being transferred vertically, so that noise caused during this transfer is amplified at the same time. As a result, from the viewpoint of a signal-to-noise ratio, the technique disclosed by the '836 publication is not the best solution.

SUMMARY OF THE INVENTION

It is an object of the present invention to provide a solid-state imaging device and a drive method therefor which are capable of improving the signal-to-noise ratio of signals obtained by electron multiplication with noise minimized.

In accordance with one important aspect of the present invention, there is provided a solid-state imaging device, which comprises an array of photo-sensitive cells formed on a semiconductor substrate for converting incident light to signal charges and a transfer path formed on the substrate and operative in response to a drive signal for reading out the signal charges from said photo-sensitive cells and transferring the signal charges read out to thereby output an electrical signal. In the solid-state imaging device, the transfer path comprises, for reading out the signal charges, a first transfer responsive to the drive signal for transferring the signal charges, and a second transfer electrode responsive to the drive signal for reading out the signal charges from the photo-sensitive cells.

In accordance with another important aspect of the present invention, there is provided a solid-state imaging device, which comprises an array of photo-sensitive cells formed on a semiconductor substrate for converting incident light to signal charges, and a transfer path formed on the substrate and operative in response to a drive signal fed through a transfer electrode for reading out the signal charges from the photo-sensitive cells and transferring the signal charges read out to thereby output an electrical signal. In the solid-state imaging device, a first impurity diffusion layer is formed immediately under the transfer electrode for temporarily storing, when reading out the signal charges, the signal charges read out from the photo-sensitive cells. At a position across the first impurity diffusion layer from the transfer electrode, a built-in electrode is formed for moving the signal charges read out in a predetermined direction. The first impurity diffusion layer is formed into an upper layer and a lower layer with respect to a direction in which the incident light is incoming. The imaging device further comprises a second impurity diffusion layer which differs in conductivity type from the first impurity diffusion layer, and which is positioned between the upper and lower layers. The signal charges read out are moved between the upper layer and the lower layer to cause electron multiplication to occur.

In accordance with still another important aspect of the present invention, there is provided a method for driving a solid-state imaging device which converts incident light to signal charges by photo-sensitive cells, transfers the signal charges from the photo-sensitive cells in response to a drive signal, and outputs the transferred signal charges as an electrical signal. The drive method includes the steps of simultaneously applying, when reading out the signal charges, a first drive signal to a first transfer electrode for transferring the signal charges, and a second drive signal to a second transfer electrode for reading out the signal charges from the photo-sensitive cells. The first drive signal is raised to a higher voltage than that of the second drive signal when electron multiplication is caused to occur to increase the signal charges. When the electron multiplication is caused to occur, the second drive signal is provided to apply a voltage that produces immediately under the second transfer electrode a potential having a slope which assists the electron multiplication to occur.

According to the present invention, in the solid-state imaging device, the transfer electrode for reading out signal charges is divided into the first transfer electrode for transferring signal charges and the second transfer electrode for reading out signal charges from the photo-sensitive cells, or the first impurity diffusion layer, formed between the transfer electrode for reading out signal charges and the built-in electrode, is separated into upper and lower layers by the second impurity diffusion layer. With these arrangements, in moving the signal charges read out, electron multiplication takes place. In the drive method for the solid-state imaging device, the first and second drive signals are simultaneously applied, and in letting electron multiplication occur, the first drive signal of a higher voltage than the voltage of the second drive signal is applied. When electron multiplication occurs, the second drive signal of a voltage is applied, which produces immediately under the second transfer electrode a potential having a slope for assisting the occurrence of electron multiplication. Thus, at the stage in which noise is hardly involved, signals are amplified. Therefore, since purely signals can be amplified, the signal-to-noise ratio and sensitivity of signals obtained can be made higher compared with prior art. It is selectable through external manipulation whether to perform electron multiplication.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
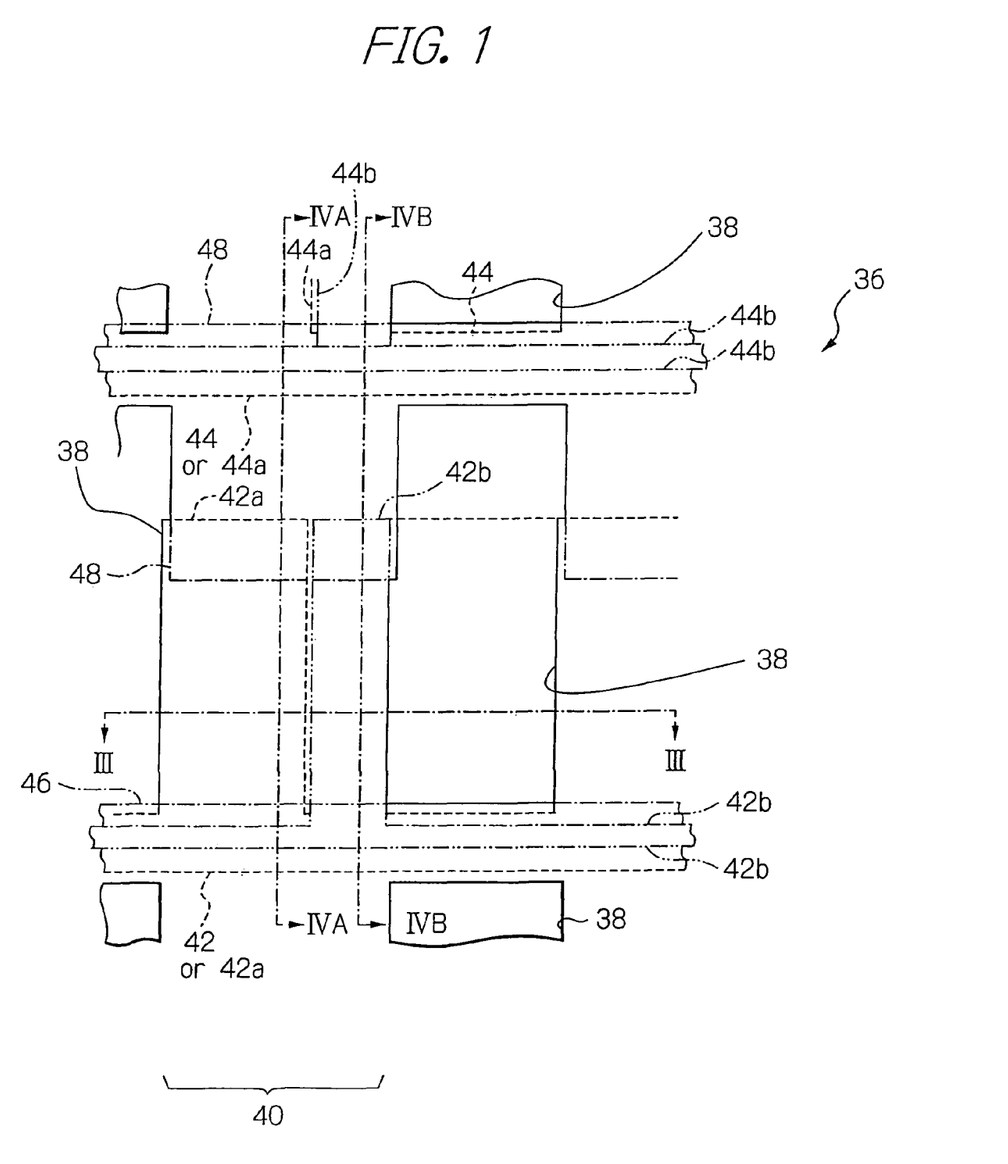
FIG. 1 is a schematic plan view showing an illustrative embodiment of a solid-state imaging device according to the present invention.

Embodiments of a solid-state imaging device according to the present invention will hereinafter be described in detail with reference to the accompanying drawings. Referring initially to FIG. 1, the solid-state imaging device 36 in accordance with an illustrative embodiment of the present invention has transfer electrodes 42 and 44 for reading out signal charges comprised of transfer electrodes 42a and 44a adapted for transferring signal charges and transfer electrodes 42b and 45b adapted for reading out signal charges from photo-sensitive cells 38, the sharp slope of a potential being formed directly under the transfer electrodes 42b and 45b to cause electron multiplication to occur so that signals are amplified prior to noise hardly being involved to thereby amplify only signals and thus enhance the signal-to-noise (S/N) ratio and sensitivity of signals obtained as compared with the prior art.

Figure 2:
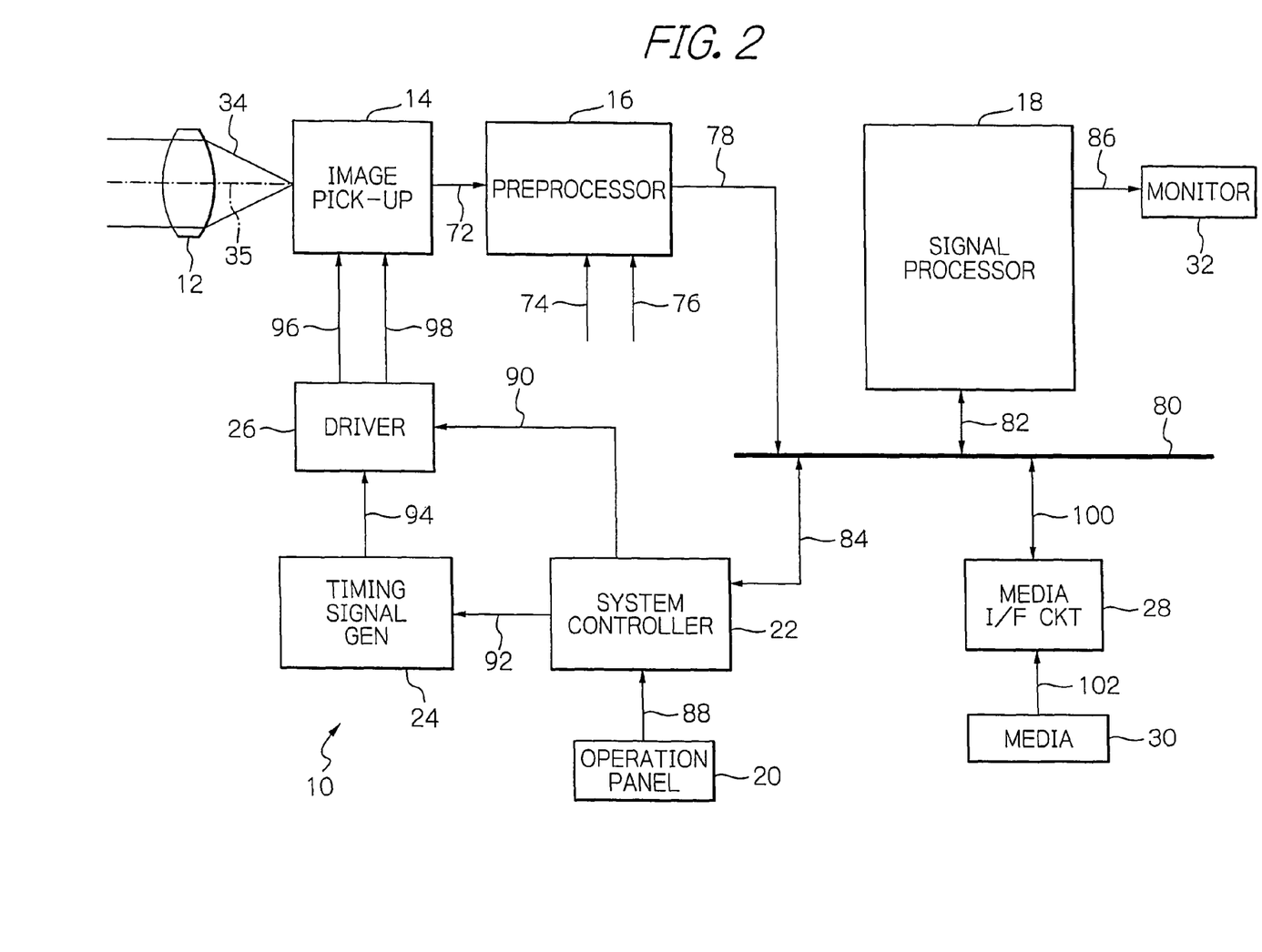
FIG. 2 is a schematic block diagram showing the configuration of a digital camera to which the solid-state imaging device shown in FIG. 1 is applied.

In the present embodiment, the solid-state imaging device 36 is applied to a digital camera 10, FIG. 2. Parts not directly relevant to understanding of the present invention will neither be described nor shown for avoiding redundancy. In the following description, signals are given the same reference numerals as the connecting lines over which the signals are transferred.

The digital camera 10 includes an optical system 12, an image pick-up subsection 14, a preprocessor 16, a signal processor 18, an operation panel 20, a system controller 22, a timing signal generator 24, a driver 26, a medium interface (I/F) circuit 28, a recording medium 30, and a display monitor 32, which are interconnected as illustrated. The functions, etc., of those components will now be described briefly.

The optical system 12 functions to receive the incident light 34 from an object to form an image on the imaging unit or image pick-up subsection 14 in response to manipulation of the operation panel 20. The optical system 12 also functions to adjust its angle of field and focal distance in response to the zooming operation on the operation panel 20 and the half-stroke depression of the shutter release button, not shown, on the panel 20. It is preferable that the optical system 12 be provided with a mechanical shutter that cuts off the incident light 34 by opening and closing to expose the image pick-up device 36 for an appropriate period of time. For clarity, the mechanical shutter is not shown.

The image pick-up subsection 14 in the present embodiment includes the solid-state imaging device 36 structured as shown in FIG. 1. The image pick-up subsection 14 may preferably be provided with a microlens array of very small-diameter lenses, or microlenses, not shown, on the incident light side with respect to the subsection 14 on the optical axis 35. Each of the microlenses focuses the incident light 34 onto corresponding one of the photo-sensitive cells 38 on which it is disposed. Although not specifically shown, in the present embodiment, each photo-sensitive device 38 has a color filter segment mounted thereon. In the solid-state imaging device 36, the photo-sensitive cells 38 are arranged in two dimensions to form an array of photo-sensitive cells, each photo-sensitive cell 38 functioning to convert the incident light 34 to electric charges and ultimately to corresponding electrical signals. The photo-sensitive cell 38 has a photo-sensitive region of a rectangular planer shape which is longer in the charge transfer direction toward a vertical transfer path 40, FIG. 1. Although not shown, each microlens is disposed to completely cover the photo-sensitive region of the corresponding photo-sensitive cell 38. The photo-sensitive cell 38 converts the incident light 34 o signal charges and stores them. The stored signal charges are in turn read out to the vertical transfer path 40 adjacent to the photo-sensitive cell 38.

The vertical transfer path 40 shown in FIG. 1 is formed by transfer electrodes 42 and 44 indicated by dashed lines, and transfer electrodes 46 and 48 indicated by one-dot chain lines. In general, the stored signal charges are read out to the vertical transfer path 40 via the transfer electrodes 42 and 44. In the present embodiment, the transfer electrode 42 is characterized in that it is comprised of a first transfer electrode 42a for simply transferring signal charges vertically and a second transfer electrode 42b corresponding to a region which covers a read-out gate described later. The transfer electrode 44 is likewise comprised of a first transfer electrode 44a for vertically transferring signal charges and a second transfer electrode 45b corresponding to a region which covers a read-out gate.

Well, reference will be made to FIGS. 3 and 4, which show the solid-state imaging device 36 cut along lines III-III, IVA-IVA, and IVB-IVB in FIG. 1, the division of the vertical transfer path 40 in the present embodiment will be described more clearly with the features of the present invention focused. First, the cross-section of the solid-state imaging device 36 taken substantially along the line III-III is shown in FIG. 3 together with potential profile.

The solid-state imaging device 36 is of a built-in-chip type of image sensor. The solid-state imaging device 36 includes an n-type silicon substrate 50, a p-type well region 52 selectively formed on one of the primary surface of the n-type silicon semiconductor substrate 50, an n-type impurity diffusion layer 54 formed on the p-type well region 52 in the corresponding size of the photo-sensitive cell 38, and a p-type impurity diffusion layer 56 formed on the n-type impurity diffusion layer 54. Thus, the photo-sensitive cell 38 forms a p-n-p-n junction on the primary surface of the n-type semiconductor substrate 50 as seen from FIG. 4. The photo-sensitive cell 38 converts the incident light 34 to corresponding signal charges and stores them in the n-type impurity diffusion layer 54.

Figure 3:
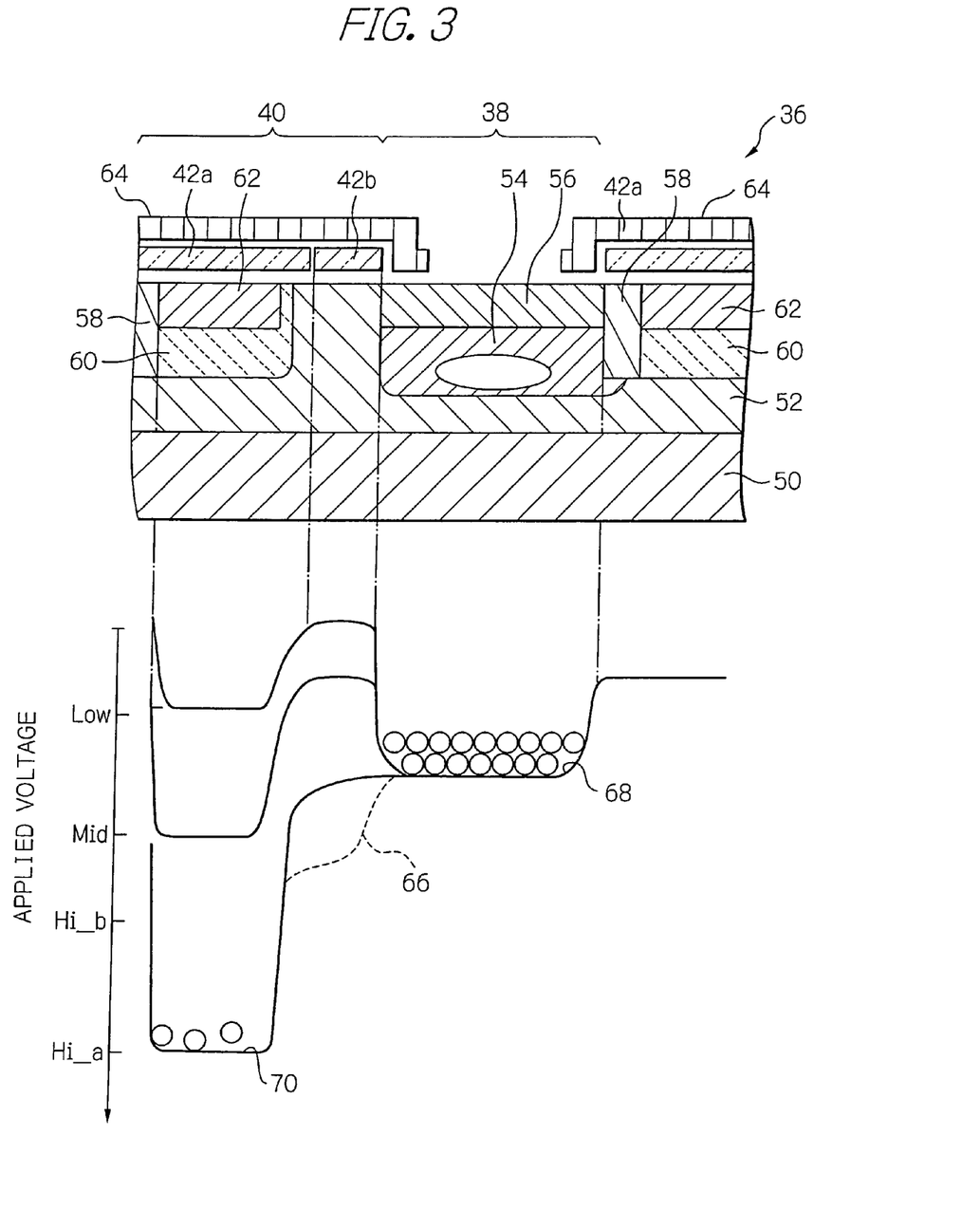
FIG. 3 is a cross-sectional view of the solid-state imaging device taken substantially along a line III-III shown in FIG. 1.
Figure 4:
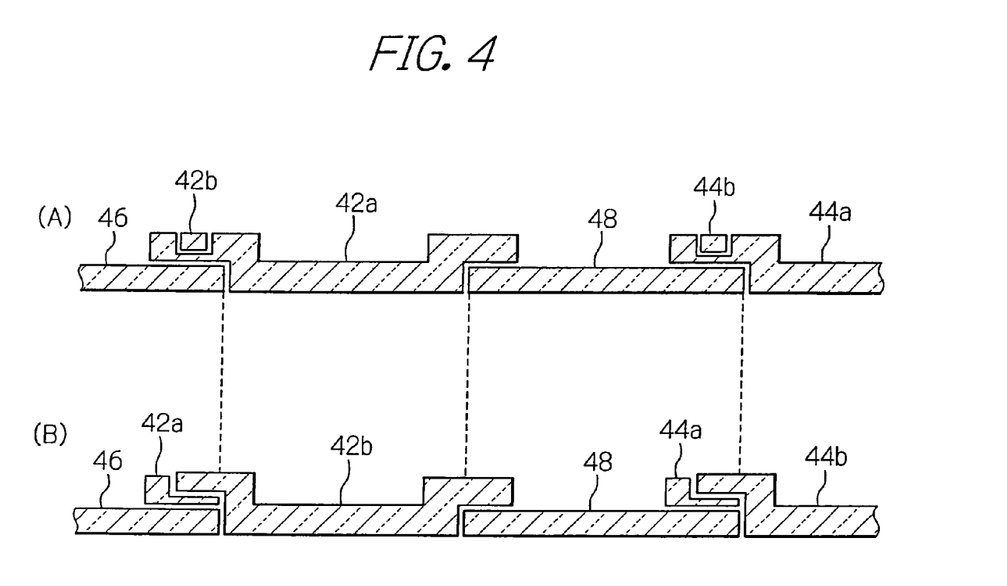
FIG. 4 is a cross-sectional view of the solid-state imaging device in FIG. 1 taken substantially along lines IVA-IVA and IVB-IVB shown in FIG. 1.

The solid-state imaging device 36 also includes a p-type impurity diffusion layer ($p^+$), which is formed as a channel stop to the right of the photo-sensitive cell 38 in FIG. 3. The p-type well region 52 is formed to the left of the photo-sensitive cell 38 and functions as a read-out gate. In order to allow the p-type well region 52 to have the read-out gate function, the well region 52 extends further to the right under the transfer electrode 42b over approximately the width of the transfer electrode 42b, in the neighborhood of the photo-sensitive cell 38.

The solid-state imaging device 36 further includes a p-type impurity diffusion layer 60, which differs in impurity concentration from the p-type well region 52 and is formed directly under the transfer electrode 42a performing the substance of vertical transfer on the vertical transfer path 40 and extends over approximately the width of the transfer electrode 42a. On the p-type impurity diffusion layer 60, an n-type impurity diffusion layer 62 is formed. Immediately under the left end of the transfer electrode 42a in FIG. 3, a p-type impurity diffusion layer ($p^+$) 58 is formed as a channel stop.

As shown in FIG. 3, the solid-state imaging device 36 further includes an optical-shield layer 64 that covers, and hence optically shields, the region excluding the opening of the photo-sensitive cell 38. The optically shielding layer 64 is made of, for example, aluminum. The transfer electrodes 42a and 42b are selectively formed on the surface of an insulating film, not shown, on which an oxide film or equivalent is formed. The transfer electrodes 42a and 42b are made of poly-crystalline silicon, or polysilicon. The potential wells shown in FIG. 3 will be described later.

Now, the cross-sections of the transfer electrodes along the lines IVA-IVA and IVB-IVB of FIG. 1 will be described. Each four transfer electrodes 42, 44, 46, and 48 in the present embodiment constitute a set of electrodes. Among them, the gate electrodes 42 and 44 are used for reading out signal charges. The solid-state imaging device 36 in the present embodiment is driven so that in reading out signal charges, impact ionization takes place. The drive may be performed by making sharp the inclination or slope of a potential well that is formed so that the number or amount of signal charges generated by photoelectric conversion is increased. Potential wells with a sharp inclination have hitherto been established by strengthening an electric field.

However, if an electric field were merely be strengthened, in the read-out gate region, then only a depressed potential 66 would have been obtained as shown in FIG. 3 and therefore the effect of impact ionization could not be sufficiently obtained. The depressed potential 66 generated by the read-out region needs to be convexed upward, or it is preferable to establish a positional profile or relationship in which a potential formed is raised.

Hence, in reading out signal charges, a voltage to be applied to the read-out gate region is discriminated from a voltage which causes impact ionization to occur so that a convex potential is formed. In order to implement the application of that voltage to the read-out gate region, the transfer electrode 42 is divided in a vertical direction into the first transfer electrode 42a for vertical transfer and the second transfer electrode 42b for the read-out gate. The transfer electrode 44 is similarly divided into the first transfer electrode 44a for vertical transfer and the second transfer electrode 45b for the read-out gate.

Since individual vertical drive signals are fed in a horizontal direction independently of each other to the respective transfer electrodes, the positions of the transfer electrodes 42a and 42b divided for reading out signal charges are reversed between the cross-section formed by the line IVA-IVA and the cross-section formed by the line IVB-IVB. Similarly, the transfer electrodes 44a and 45b are reversed in position between the cross-section formed by line IVA-IVA and the cross-section formed by line IVB-IVB.

Figure 5:
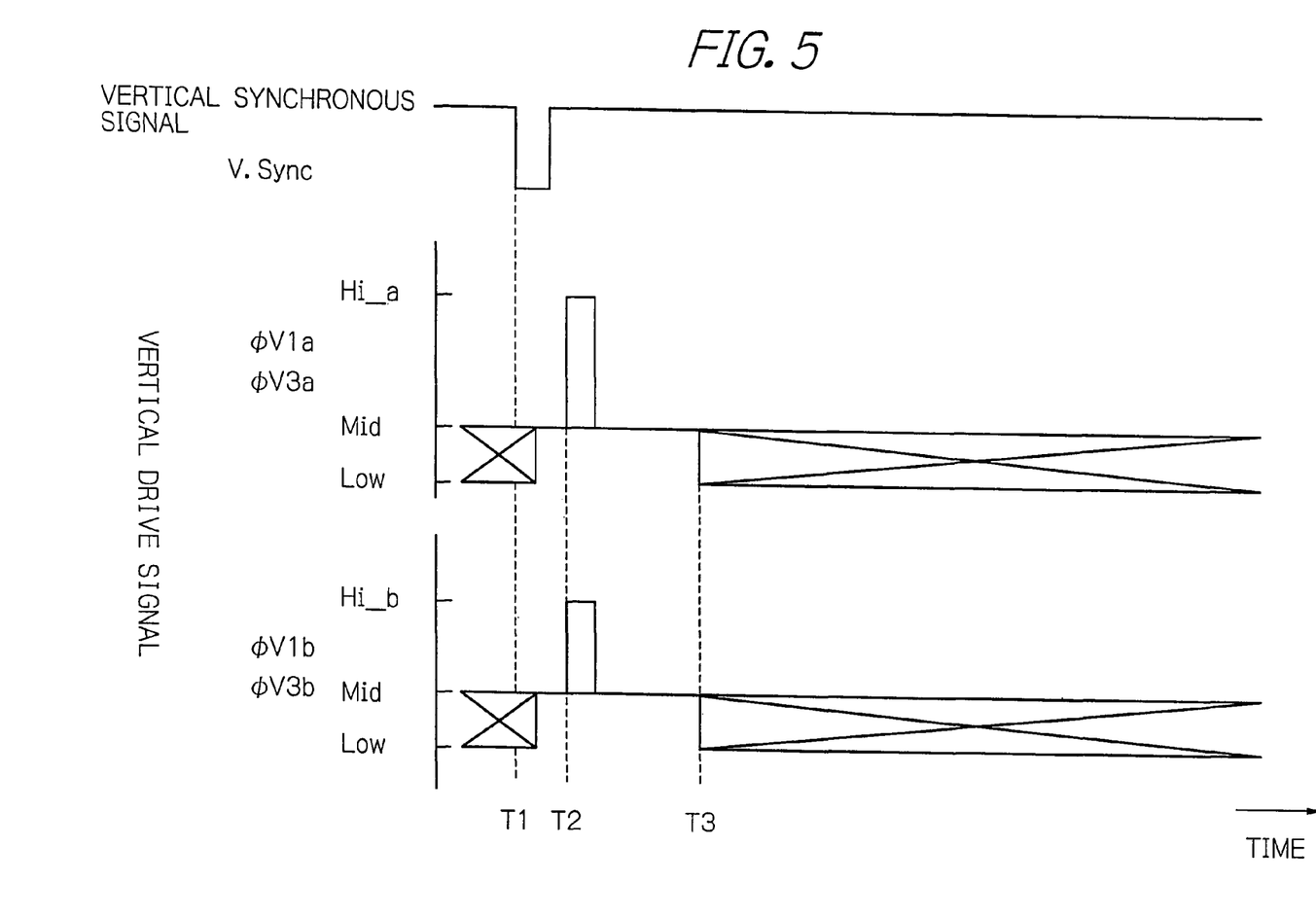
FIG. 5 is a timing chart showing the voltages and timing of a vertical drive signal that is output by the driver of the digital camera shown in FIG. 2.

Now, the driving of the solid-state imaging device 36 and generation of potential wells will be described by referring to FIGS. 3 and 5. The photo-sensitive cell 38 converts the incident light 34 to signal charges and stores them in an established potential well 68. The stored signal charges are read out to the vertical transfer path 40. In reading out signal charges, as shown in FIG. 5, after a predetermined time has elapsed from time T1 at which a vertical synchronous signal (V. Sync) goes negative, the driver 26 applies a high-level vertical drive signal to the transfer electrode for vertical transfer. Usually, by the application of the vertical drive signal, the potential of the read-out gate becomes higher than that of the photo-sensitive cell 38, so that a potential barrier, which is to be formed for storing signal charges, disappears. In this state, the read-out gate is in its open state. In the open state, the potential forms a potential well 70 directly under the region functioning as the vertical transfer path. The signal charges stored in the photo-sensitive cell 38 move to the potential well 70, thus being read out.

The transfer electrode has hitherto functioned as both a read-out gate electrode and a vertical transfer electrode. Because of such usage of the transfer electrode, the potential 66 formed in the read-out gate region had a slow slope. Since signal charges move along the slow slope, the reading-out of signal charges could not cause impact ionization to occur. That is, signal charges could not be increased through electron multiplication.

By contrast, with the illustrative embodiment, the transfer electrodes 42 and 44 are respectively divided, as shown in FIG. 1, into two, i.e. the vertical transfer and read-out electrodes 42a and 42b and the vertical transfer and read-out electrodes 44a and 44b. In addition, the vertical drive signals are adjusted, when reading out signal charges, according to the appropriate transfer electrodes as shown in FIG. 5 to be applied thereto. More specifically, vertical drive signals øV1a and øV3a are applied to the transfer electrodes 42a and 44a at a level Hi_a, respectively. At the same time, vertical drive signals øV1b and øV3b are applied to the transfer electrodes 42b and 45b at a level Hi_b, respectively. Particularly, the level Hi_b is partially adjusted so that the potential in the read-out gate region does not form a slow difference in height but forms a sharp potential valley. The level Hi_a is higher than the level Hi_b. As a result, electron multiplication takes place in signal charges, whereby signals are amplified. Because electron multiplication is caused to occur in a signal read-out stage in which noise is hardly involved, signal charges, i.e. purely signals only, can be amplified without amplifying noise. Consequently, the signal-to-noise ratio of signals obtained can be made higher.

In the case of the vertical transfer being performed after time T3 shown in FIG. 5, or in the case where electron multiplication is not allowed to occur at time T2, vertical drive signals of the same level are applied to the transfer electrodes 42a and 42b at the same time. The application of the vertical drive signals of the same level allows the transfer electrodes 42a and 42b to function as one transfer electrode, as with the prior art. The same applies to the transfer electrodes 44a and 44b. More specifically, vertical drive signals for vertical transfer are applied to the transfer electrodes (42a, 42b) and (44a, 44b) at levels L and M without discrimination.

Note that the method of causing electron multiplication to occur in signal charges is not to be limited to the specific example of the transfer electrodes split in reading out signal charges and of the manner of applying the voltages to the transfer electrodes thus split.

Returning back to FIG. 2, the solid-state imaging device 36 transfers the signal charges, obtained at the respective pixels, vertically and horizontally in order in the manner described above. Then, the solid-state imaging device 36 feeds the signal charges to an output amplifier, not shown, and converts them to a corresponding analog voltage signal 72. The imaging unit 14 feeds the analog voltage signal 72 to the preprocessor 16.

The preprocessor 16 includes a correlated double sampling circuit, a gain-controlled amplifier, and an analog-to-digital (A/D) converter for noise removal, although not specifically shown. The timing signal generator 24 is adapted to feed a correlated double sampling pulse 74 to the correlated double sampling circuit as a sampling signal and also feed a conversion clock signal 76 to the A/D converter. The preprocessor 16 is constructed to perform noise removal, waveform shaping, and digitizing on the analog signal 72 to output all of the resultant data to the signal processor 18 in the form of digital data, i.e. image data 78, over a bus 80 and a signal line 82. The signal line 82 is adapted to convey the data and control signals.

The signal processor 18 has a signal processing function described below, with respect to the digital data fed thereto. The signal processor 18 is equipped with an evaluation value calculator and an image memory device, including an automatic white balance (AWB) processor, although not shown. The signal processor 18, in addition to this, performs a gamma correction, an image signal synchronization, an image transform, a compression/decompression coding, an image reduction, and other processes. The evaluation value calculator is operative in response to the image data, after gamma-corrected, obtained in a preliminary photometry to calculate a diaphragm value, a shutter speed, a white balance adjustment value, and a gradation correction value, etc., and, based on this calculation, calculates an integrated value so that parameters suitable for the fed image data are obtained. The signal processor 18 feeds the integrated value to the system controller 22 as a signal 62 over the bus 80 and signal line 84.

Note that while the evaluation value calculator is disposed in the signal processor 18 in the illustrative embodiment, it may be provided in the system controller 22. In the latter case, the signal processor 18 is adapted to feed the system controller 22 with the image data after gamma-corrected.

The digital data 78 from the preprocessor 16 is fed as image data to the image memory device of the signal processor 18 over the bus 80 and signal line 82. The signal processor 18 is controlled in response to a control signal 84 fed from the system controller 22 over a control bus. Also, a timing signal not shown is fed from the timing signal generator 24 to the signal processor 18. This timing signal includes a horizontal synchronous signal HD, a vertical synchronous signal VD, and an operating clock signal for the components to be described later. The signal processor 18 functions to feed the generated image data 86 to the monitor 32.

The operation panel 20 includes a mode selector and a shutter release button, although not shown. The mode selector functions to select any one of still picture photographing, motion picture capturing, low sensitivity, and high sensitivity modes. The low and high sensitivity modes are selectable in terms of the ISO (International Organization for Standardization) sensitivities. The mode selection can also be set up to ISO sensitivities 100 to 3200. The mode selector outputs a selected mode to the system controller 22 in the form of instruction signal 88.

The shutter release button is a two-stroke key having its first stroke and second stroke following the former. The first stroke sets the digital camera 10 to its preliminary imaging stage (S1), while the second stroke defines a trigger timing, which sets the digital camera 10 to an actual imaging stage (S2). The operation panel 20 is thus adapted to issue the instruction signal 88 to the system controller 22.

The system controller 22 may be implemented by a microcomputer system including a central processing unit (CPU) that controls the common subsections and a part which performs a digital process of the digital camera 10. The system controller 22 may advantageously include a scene identifier, an electrically erasable programmable read-only memory (EEPROM) for storing data of coefficients, and a read-only memory (ROM) for storing instructions for operational procedures and program sequences, although not shown. The system controller 22 may perform processing by means of software programs and be fed with a selection signal 84 representative of a result selected by the signal processor 18.

The system controller 22 functions to compare the ISO sensitivity, contained in the signal 88 fed from the manipulator 20, with a sensitivity threshold value. The system controller 22 also functions as deciding whether to cause electron multiplication to occur, and setting a diaphragm value and a shutter speed in response to the selection signal 84 fed from the signal processor 18. The system controller 22 also functions to generate a drive control signal 90 in response to the decided result and setting, and output it to the driver 26. The drive control signal 90 is used for controlling the voltage of a read-out gate pulse that is output by the driver 26.

The system controller 22 has a function to generate a control signal 92 in response to the instruction signal 88 indicating trigger timing which is fed from the operation panel 20. The generated control signal 92 is output to the timing signal generator 24. The system controller 22 further has a function to generate a control signal 84 for controlling the line interpolation and the signal generation in the signal processor 18 and controlling the signal processing, as well as controls the reading and writing the recording medium 30. Although not shown, the system control 22 further has a function to control the operating timing for the preprocessor 16.

The timing signal generator 24 has a function of generating a variety of timing signals on the basis of a reference clock signal, not shown. Examples of the timing signals, in addition to a horizontal transfer signal, are a vertical synchronous signal, a horizontal synchronous signal, a field shift pulse signal, a vertical transfer signal, an electronic shutter pulse signal, and so forth. The timing signal generator 24 also has a function of generating a CDS (Correlated Double Sampling) pulse signal 74 and a conversion clock signal 76 to output them to the preprocessor 16. The timing signal generator 24 supplies the driver 26 with the timing signals 94, which include the vertical synchronous signal, horizontal synchronous signal, field shift pulse signal, vertical transfer signal, and electronic shutter pulse signal thus generated.

The driver 26 has a function of generating a variety of drive signals on the basis of the timing signals 94 and control signal 90. For instance, in the case where the driver 26 generates vertical drive signals of four phases, the driver 26 generates vertical drive signals (øV1a, øV1b) 96 and (øV3a, øV3b) 98 at different voltages or the same voltage in response to the control signal 90, and feeds them to the image pick-up subsection 14. The driver 26 feeds, in addition to the vertical drive signals, the solid-state imaging device 36 of the image pick-up subsection 14 with a drive signal generated on the basis of the timing signals 94, although not shown. The driver 26 also provides the mechanical shutter with a drive signal, not shown, in response to which the mechanical shutter opens and closes at the timing of actual imaging that is defined by the shutter release button depressed on the operation panel 22.

The medium interface (I/F) circuit 28 has a function of adjusting electrical properties and timing in writing in and reading out data to and from the medium 30, which may be a memory card type of recording medium. The medium interface 28 receives image data 100 and outputs it to the medium 30 as image data 102. The medium interface circuit 28 also has functions of writing compressed image data 100 and 102 to the medium 30 and reading out recorded image data 102 and 100 from the medium 30.

The medium 30 stores the image data 82 fed from the signal processor 18, and is implemented by a storage medium such as a semiconductor memory, etc. The writing/reading of data is controlled in response to a control signal, although not shown, from the system controller 22. The display monitor 32 displays an image data 86 fed from a display controller, not shown, on its display device in operation.

The solid-state imaging device 36 thus constructed can amplify signals through electron multiplication at an earlier state in which noise is hardly involved, such as when reading out signal charges from the photo-sensitive cell 38 of the imaging device 36. Because of this, signal charges, that is, pure signals can be amplified without amplifying noise. Thus, the signal-to-noise ratio of signals thus obtained can be made higher.

Now, a description will be given of an alternative embodiment to which the solid-state imaging device 36 is applied. The solid-state imaging device 36 of the present alternative embodiment partially differs in internal structure from the solid-state imaging device 36 shown in FIG. 1. The internal structure of the solid-state imaging device 36 of the alternative embodiment will be described based on the cross-section taken substantially along the line III-III of FIG. 1. Like parts or components are given the same reference numerals and a detailed description of such parts or components will not be repeated for avoiding redundancy.

Figure 6:
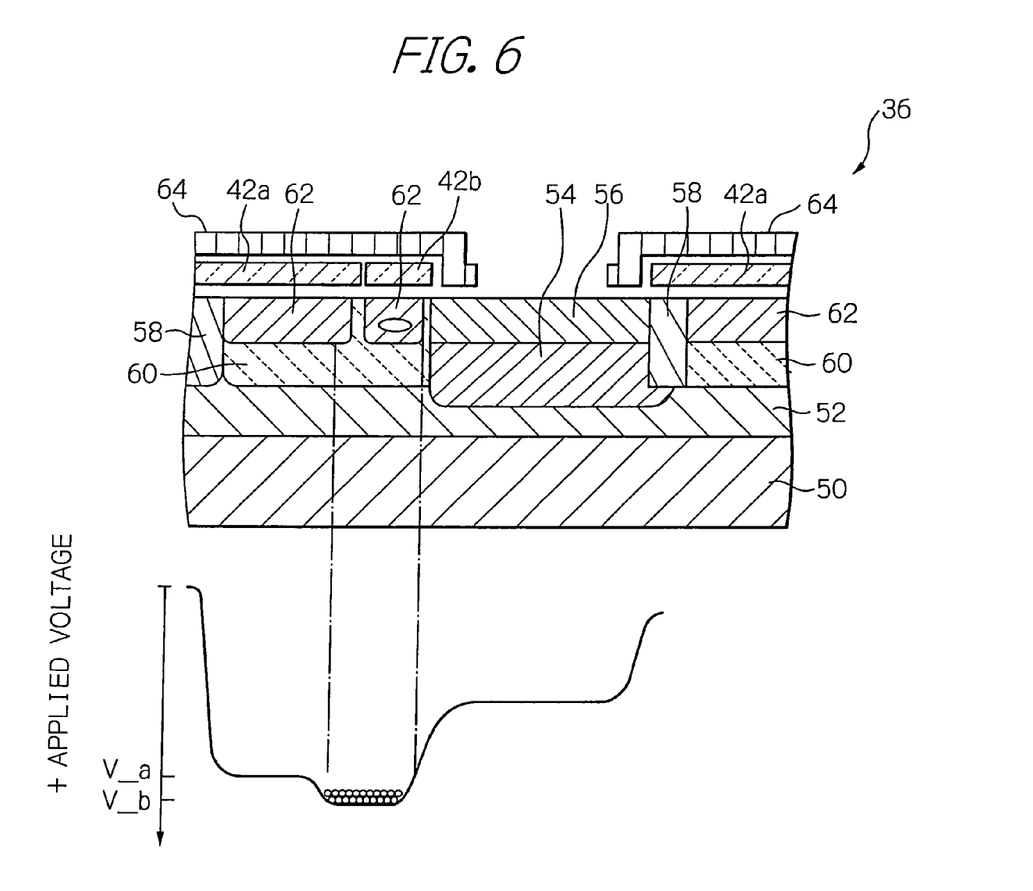
FIG. 6 is a cross-sectional view of an alternative embodiment of the solid-state imaging device of the present invention taken substantially along the line III-III of FIG. 1 together with a potential profile.

The solid-state imaging device 36 of the alternative embodiment includes, as shown in FIG. 6, the n-type impurity diffusion layer 62 formed directly under a transfer electrode 42b corresponding to a read-out gate region. The n-type impurity diffusion layer 62 is covered with the p-type impurity diffusion layer 60, which in turn corresponds to the boundary between the read-out gate and the vertical transfer path. Thus, since the n-type impurity diffusion layer 62 is formed immediately under the transfer electrode 42b, the n-type impurity diffusion layer 62 can cause electrons to stay temporarily therein.

The stay of electrons in the n-type impurity diffusion layer 62 can be realized by applying a voltage V_b to the transfer electrode 42b and a voltage V_a to the transfer electrode 42a. The solid-state imaging device 36 forms a potential well, as shown in FIG. 6. This potential well formation is performed by making the applied voltage V_b higher than the applied voltage V_a.

Figure 7:
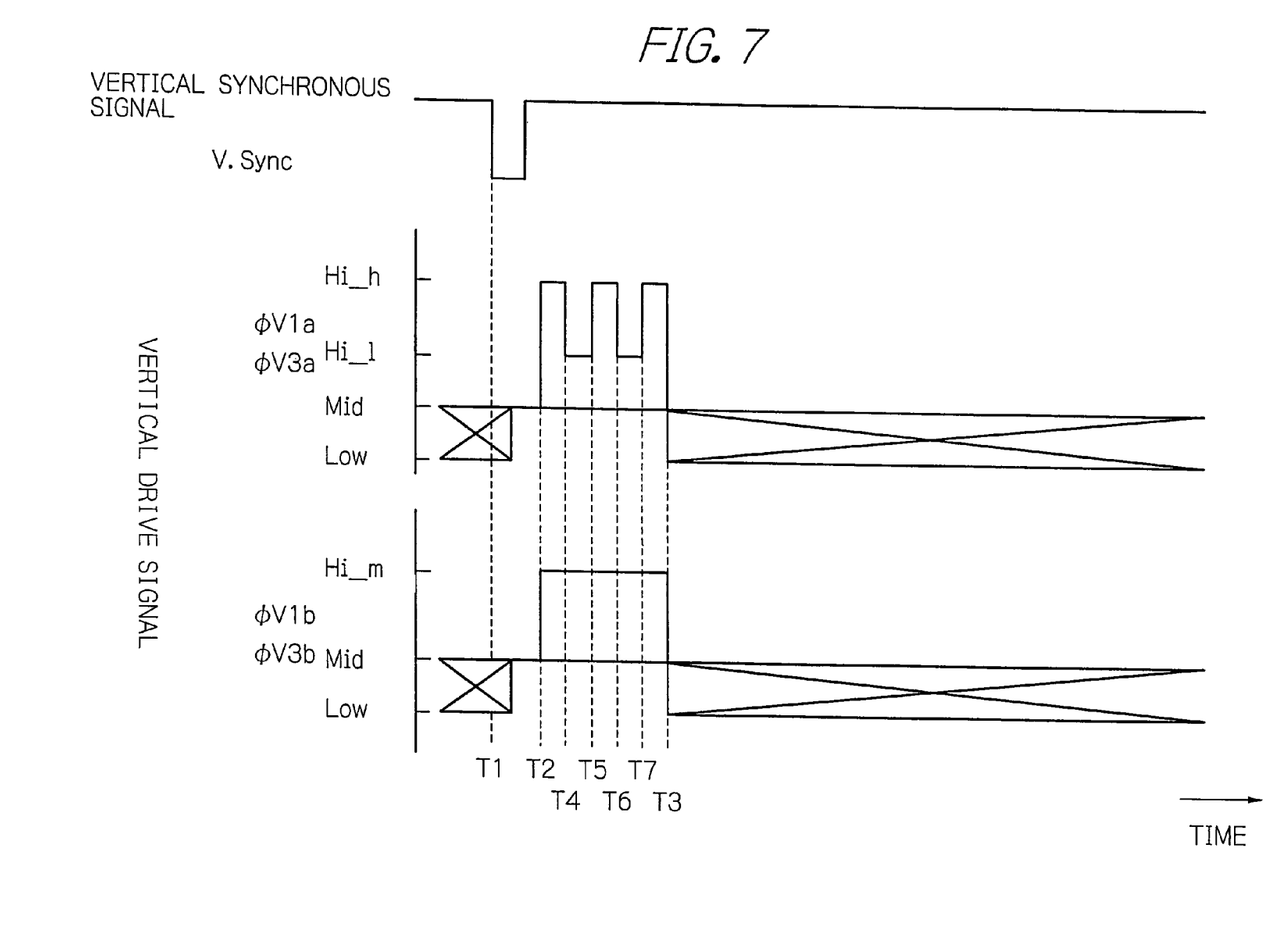
FIG. 7 is a timing chart showing the voltages and timing of a vertical drive signal that is fed to the solid-state image device shown in FIG. 6.

If the solid-state imaging device 36 of the alternative embodiment is operated in cooperative with the electron multiplication in the preceding embodiment, the number or amount of electrons can be further increased. The principle of the driving of the solid-state imaging device 36 and the electron multiplication in the alternative embodiment will be described with reference to FIGS. 7 and 8. A timing chart of FIG. 7 is basically the same as the preceding embodiment except that between times T2 and T3, the voltages of vertical drive signals (øV1a, øV3a) and (øV1b, øV3b) to be applied to the transfer electrodes 42a and 42b are continuously applied. The vertical drive signals (øV1a, øV3a) vary in voltage at times T2, T4, T5, T6, T7, and T3.

More specifically, the vertical drive signals (øV1a, øV3a) apply a voltage Hi_h between times T2 and T4, between times T5 and T6, and between times T7 and T3. The vertical drive signals (øV1a, øV3a) also apply a voltage Hi_l between times T4 and T5 and between times T6 and T7. The vertical drive signals (øV1b, øV3b) apply a predetermined voltage Hi_m between times T2 and T3. The magnitude relationship between the applied voltages is that the voltage Hi_h is higher than the voltage Hi_m, which is higher than the voltage Hi_l. Note that if applied voltages meet the above magnitude relationship, then they need not be fixed voltages.

Figure 8:
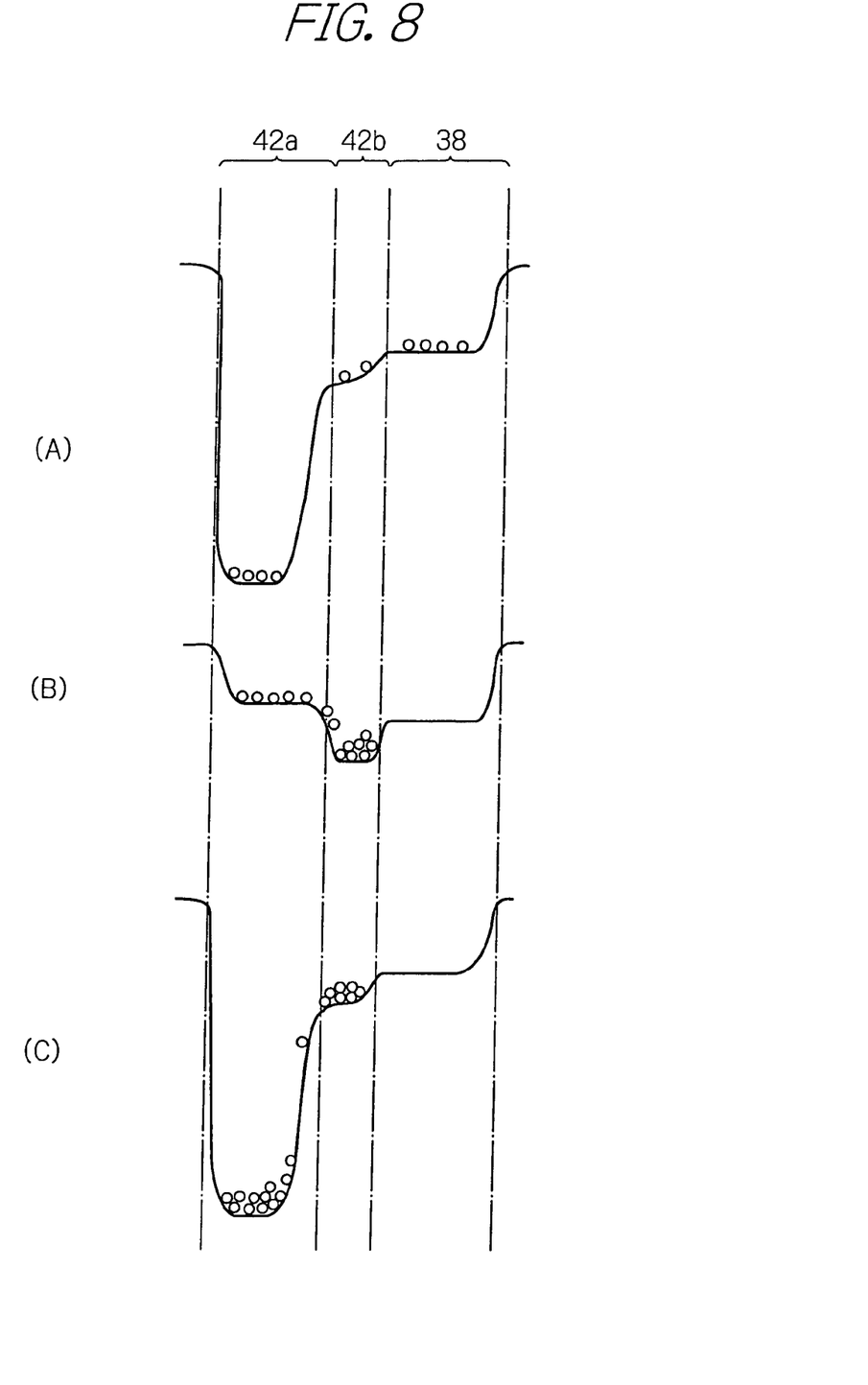
FIG. 8 demonstrates potential wells and electron multiplication that are produced upon application of the vertical drive signals shown in FIG. 7.

With variations in the timing, a potential varies as shown in FIG. 8, lines (A) (B) and (C). For a simplified example, assume that the initial number of signal charges, that is, electrons is ten. Also, assume that an electron multiplication factor for the solid-state imaging device 36 is 140%. A potential well in FIG. 8, line (A), represents the state in which electron multiplication takes place at time T2, as disclosed in the preceding embodiment. The electron multiplication increases the initial number of electrons to 14.

Between times T4 and T5, a potential well shown in FIG. 8B is formed. This potential well formation causes electrons to move from the vertical transfer path 40 to the region corresponding to the read-out gate, that is, the region of the transfer electrode 42b. During this movement, the voltage applied to the transfer electrode 42b is a voltage Hi_m, so that electron multiplication does not occur. Therefore, the number of electrons remains 14.

Between times T5 and T6, the voltage applied to the transfer voltage 42a goes to a voltage Hi_h again, so that a potential well shown in FIG. 8, line (C), is formed. This causes electron multiplication to occur. As a result, the number of electrons after moved is increased to 20.

Between times T6 and T7, the potential well formation shown in FIG. 8, line (B), causes the electrons in the vertical transfer path 40 (transfer electrode 42a) to move without electron multiplication. Finally, between times T7 and T3, the potential well formation in FIG. 8, line (C), causes the electrons in the read-out gate corresponding region (transfer electrode 42b) to move with electron multiplication. After the movement, the number of electrons is increased to 28. Thus, if electrons are caused to move between the vertical transfer path and the read-out gate corresponding region while they are being multiplied several times, the number of electrons can be increased.

In contrast, in the case where the solid-state imaging device 36 of the alternative embodiment is to be driven so that electron multiplication does not take place, the solid-state imaging device 36 is driven at the timing shown in FIG. 5. The relationship between applied voltages in this case is the voltage Hi_a higher than the voltage Hi_b. These applied voltages are set so that the slope of the potential well in the read-out gate corresponding region becomes slow.

If impact ionization or electron multiplication takes place, multiplication factors vary because of structural variations in pixels and therefore there is a possibility that fixed pattern noise will increase. It is known that fixed pattern noise is proportional to an incident light quantity. Therefore, in the case where an object is photographed under a sufficient light quantity, there are cases where the rate of increase of fixed pattern noise becomes higher than that of signals obtained by electron multiplication. Therefore, there are cases where it is preferable to suppress the occurrence of electron multiplication from the viewpoint of a signal-to-noise ratio. In order to avoid such a disadvantage of fixed pattern noise, it is desirable that the solid-state imaging device 36 be driven differently in dependent upon the imaging sensitivity.

Figure 9:
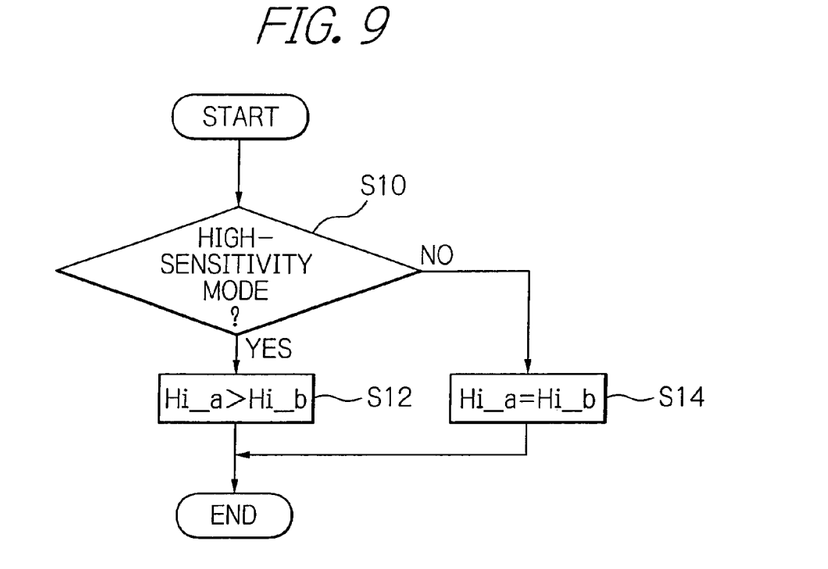
FIG. 9 is a flowchart useful for understanding how the solid-state imaging device of FIG. 6 applies voltages according to sensitivity modes.

In the digital camera 10 with the solid-state imaging device 36, it is decided, as shown in FIG. 9, whether or not an imaging sensitivity (ISO sensitivity) is higher than a predetermined sensitivity threshold value (step S10). When the imaging sensitivity (ISO sensitivity) is higher than the predetermined sensitivity threshold value (YES), i.e. the high-sensitivity mode, the processing advances to the step S12 of setting different drive voltages. When it is equal to or lower than the threshold value (NO), the processing advances to the step S14 of setting equal drive voltages.

Different drive voltages are set so that they meet the relationship of voltage Hi_a>voltage Hi_b in the step S12. Equal drive voltages are set so that they meet the relationship of voltage Hi_a=voltage Hi_b in the step S14. After these drive voltages have been set, the setting of drive voltages ends. This enables the digital camera 10 with the solid-state imaging device 36 to effectively use the electron multiplication function.

Figure 10:
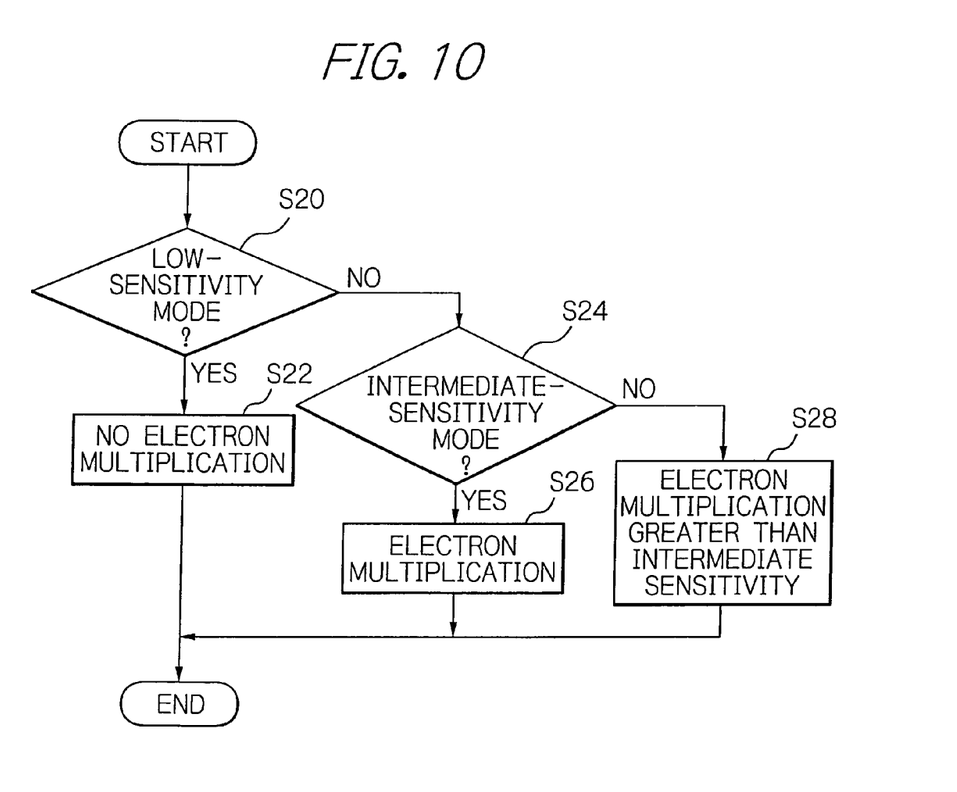
FIG. 10 is a flowchart useful for understanding how the solid-state imaging device of FIG. 6 applies voltages according to finer sensitivity modes.

The digital camera 10 may be designed to be operative in response to finer sensitivity modes. In the digital camera 10, it is decided, as shown in FIG. 10, whether or not an imaging sensitivity (ISO sensitivity) exceeds a low sensitivity threshold value (step S20). When it does not exceed the threshold value, i.e. the low-sensitivity mode (YES), the processing advances to low-sensitivity setting (step S22). When it is higher than the threshold value (NO), the processing advances to the step S24 of an intermediate-sensitivity setting process. The low-sensitivity setting is performed so that electron multiplication does not occur (step S22).

In the step S20 of intermediate-sensitivity determination, it is decided whether or not the imaging sensitivity (ISO sensitivity) exceeds an intermediate sensitivity threshold value. When it does not, that is, in the intermediate-sensitivity mode (YES), the processing advances to the step S26 of intermediate-sensitivity setting. On the other hand, when it is higher than the threshold value (NO), the processing advances to the step S28 of high-sensitivity setting. In the intermediate-sensitivity setting step S26, for example, electron multiplication is caused to the extent of predetermined number of times shown in the timing chart of FIG. 7.

In the step S28 of high-sensitivity setting, electron multiplication is performed, for instance, as shown in the timing chart of FIG. 7. The number of times in the high-sensitivity setting is however set greater than the number of times in the intermediate-sensitivity setting. After drive voltages have been set according to these sensitivity modes, the control proceed to the end, thus completing the drive voltage setting. This enables the digital camera 10 with the solid-state imaging device 36 to accomplish the electron multiplication function more effectively.

Now, a description will be given of another alternative embodiment to which the solid-state imaging device 36 is applied. The solid-state imaging device 36 of the instant alternative embodiment partially differs in internal structure from the solid-state imaging device 36 shown in FIG. 1. Like parts or components are given the same reference numerals and therefore a repetitive description thereon will be omitted for avoiding redundancy. Although a plan view of the alternative embodiment is not presented, the internal structure of the solid-state imaging device 36 will be described based on the cross-section taken along the same position as the line III-III of FIG. 1.

Figure 11:
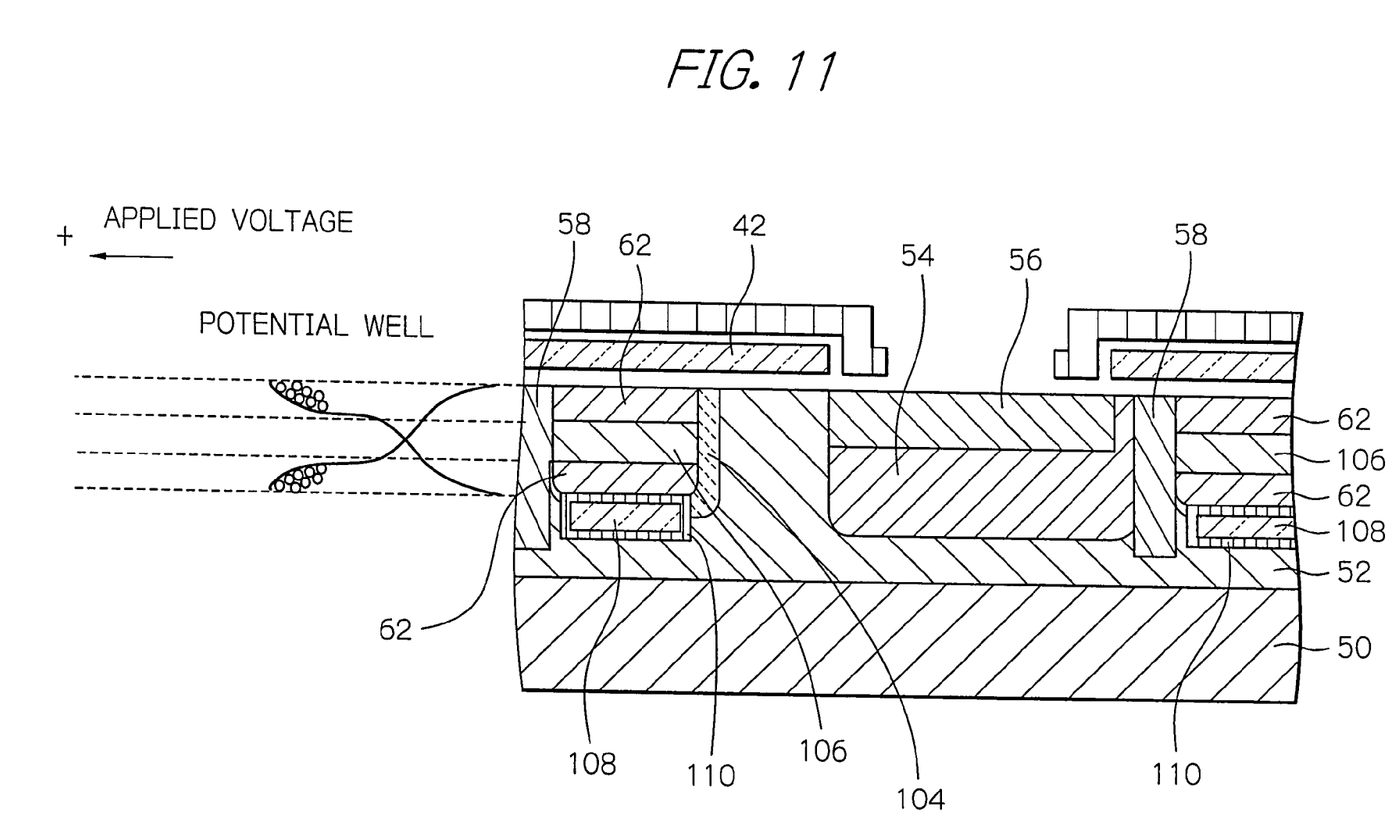
FIG. 11 is a cross-sectional view of another alternative embodiment of the solid-state imaging device of the present invention taken substantially along the line III-III of FIG. 1 together with a potential profile.

The solid-state imaging device 36 of the alternative embodiment has, as shown in FIG. 11, the vertical transfer electrode 42 formed which is not divided. The solid-state imaging device 36 of the alternative embodiment has the n-type impurity diffusion layer 62 formed just under the region of the transfer electrode 42a of the preceding embodiment. The n-type impurity diffusion layer 62 is covered with a p-type impurity diffusion layer 104 differing in impurity concentration from the p-type impurity diffusion layer 60. The n-type impurity diffusion layer 62 is separated into two, i.e. upper and lower layers, by a partition layer 106 formed of a p-type impurity diffused in the same impurity concentration as the p-type impurity diffusion layer 60. On the lower layer of the n-type impurity diffusion layer 62, an electron-multiplier electrode 108 is formed. The electron-multiplier electrode 108 is formed over approximately the same width as the transfer electrode 42a and covered with an insulating layer 110. Although not shown, a drive signal to move electrons is input to the electron-multiplier electrode 108 at timing described later.

With the solid-state imaging device 36 thus formed, by reading out signal charges from the photo-sensitive cells 38 to the n-type impurity diffusion layer 62 of the vertical transfer path, and then varying the voltage that is applied to the transfer electrode 42 and electron-multiplier electrode 108, the signal charges readout are moved back and forth between these electrodes to cause the electron multiplication phenomenon to occur.

When the electron multiplication phenomenon occurs in the upper and lower layers, potential wells are formed as shown in FIG. 11. When reading out signal charges from the photo-sensitive cells 38 to the upper layer, a vertical drive signal øV1a, FIG. 12, which is fed to the transfer electrode 42 applies a voltage Hi, and a charge transfer signal øVamp that is fed to the electron-multiplier electrode 108 applies a voltage Low. When moving signal charges to the lower layer, the vertical drive signal øV1a that is fed to the transfer electrode 42 applies the voltage Low, and the charge transfer signal øVamp that is fed to the electron-multiplier electrode 108 applies the voltage Hi. The electron-multiplication factor can be controlled by adjusting the varying applied voltage and the number of backward and forward movements. When the occurrence of electron multiplication is undesirable, it is preferable to horizontally transfer signal charges, after read out from the photo-sensitive cells 38, to the vertical transfer path.

Figure 12:
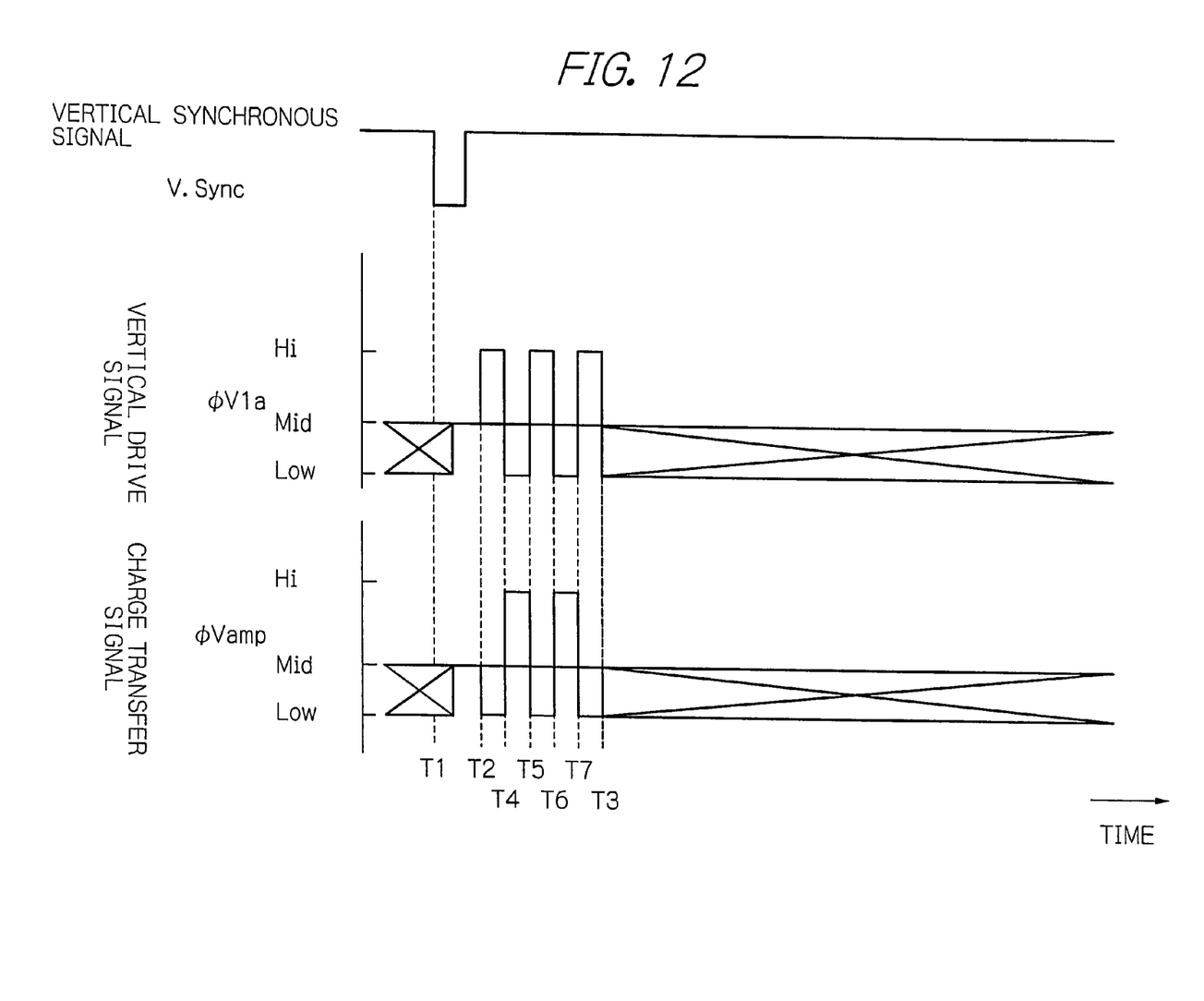
FIG. 12 is a timing chart showing the voltages and timing of a vertical drive signal and a charge transfer signal that are fed to the solid-state image device shown in FIG. 11.

Now, a description will be given of the timing at which the solid-state imaging device 36 of the instant alternative embodiment is driven. The timing chart in FIG. 12 is basically the same as the timing chart shown in FIG. 7. A point differing from the preceding embodiment is the applied voltage of the vertical drive signal øV1a and the applied voltage of the charge transfer signal fed to the electron-multiplier electrode 108. The vertical drive signal øV1a is applied to the transfer electrode 42. In the present alternative embodiment, to the transfer electrode 42, a vertical drive signal of voltage Hi is applied between times T2 and T4, between times T5 and T6, and between times T7 and T3, and a vertical drive signal of voltage Low is applied between times T4 and T5 and between times T6 and T7.

The charge transfer signal øVamp is applied to the electron-multiplier electrode 108. In the alternative embodiment, to the electron-multiplier electrode 108, a vertical drive signal of voltage Hi is applied between times T4 and T5 and between times T6 and T7, and a vertical drive signal of voltage Low is applied between times T2 and T4, between times T5 and T6, and between times T7 and T3.

By thus applying the vertical drive signal øV1a and charge transfer signal øVamp, stored signal charges are read out from the photo-sensitive cells 38 to the vertical transfer path between times T2 and T4. Then, the voltage application between times T4 and T5 causes the signal charges to move from the upper layer to the lower layer to cause electron multiplication to occur. Between times T5 and T6, signal charges in the lower layer are moved to the upper layer by the applied voltage, and electron multiplication is also caused to occur. Between times T6 and T7 and between times T7 and T3, signal charges are moved according to applied voltages from the upper layer to the lower layer and then from the lower layer to the upper layer, and electron multiplication is caused to occur during the respective time intervals. Since electron multiplication can be caused to occur during each time interval, the instant alternative embodiment is higher in efficiency than the preceding embodiments. It is preferable that the number, i.e. times, of movements of signal charges between the upper and lower layers after being read out from the photo-sensitive cell be adjusted according to amplification factors.

At time T3 when vertical transfer is started, it is desirable to finish charge transfer by moving signal charges to the upper layer. As shown in FIGS. 9 and 10, it is preferable that the alternative embodiment be likewise operated so that the number of occurrences of electron multiplication is adjusted according to sensitivity modes.

By thus moving signal charges a plurality of times between the upper and lower layers formed just under the vertical transfer path to cause electron multiplication to occur, the number, or amount, of electrons generated can be increased.

The entire disclosure of Japanese patent application No. 2006-251236 filed on Sep. 15, 2006, including the specification, claims, accompanying drawings and abstract of the disclosure, is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A solid-state imaging device comprising:
   an array of photo-sensitive cells formed on a semiconductor substrate for converting incident light to signal charges;
   a transfer path formed on the substrate and operative in response to a drive signal fed through a transfer electrode for reading out the signal charges from said photo-sensitive cells and transferring the signal charges read out to thereby output an electrical signal;
   a first impurity diffusion layer formed immediately under said transfer electrode for temporarily storing, when reading out the signal charges, the signal charges read out from said photo-sensitive cells;
   a built-in electrode formed at a position across said first impurity diffusion layer from said transfer electrode for moving the signal charges read out in a predetermined direction;
   said first impurity diffusion layer being formed into an upper layer and a lower layer with respect to a direction in which the incident light is incoming; and
   a second impurity diffusion layer different in conductivity type from said first impurity diffusion layer and positioned between said upper layer and said lower layer,
   the signal charges read out being moved between said upper layer and said lower layer to cause electron multiplication to occur.

2. The solid-state imaging device in accordance with claim 1, wherein said first impurity diffusion layer is of a negative conductivity type and said second impurity diffusion layer is of a positive conductivity type.

3. A method for driving a solid-state imaging device which converts incident light to signal charges by photo-sensitive cells, transfers the signal charges from the photo-sensitive cells in response to a drive signal, and outputs the transferred signal charges as an electrical signal, said method comprising the steps of:
   simultaneously applying, when reading out the signal charges, a first drive signal to a first transfer electrode for transferring the signal charges, and a second drive signal to a second transfer electrode for reading out the signal charges from the photo-sensitive cells;
   raising the first drive signal to a higher voltage than a voltage of the second drive signal when electron multiplication is caused to occur to increase the signal charges; and
   providing, when causing the electron multiplication to occur, the second drive signal to apply a voltage that produces immediately under the second transfer electrode a potential having a slope which assists the electron multiplication to occur,
   wherein, when reading out the signal charges with the number of the signal charges substantially maintained, the voltages of the first and second drive signals are made substantially equal to each other and applied.

4. The method in accordance with claim 3, wherein
   said first drive signal has a first interval, which is higher in voltage than the second drive signal and causes the electron multiplication to occur, and a second interval, which is lower in voltage than the second drive signal,
   said method further comprising the step of adjusting a number of repetitions of the first interval and the second interval according to an amplification factor of the electron multiplication and applying the first drive signal.

5. The method in accordance with claim 3, wherein the first drive signal takes, in a first interval in which the signal charges read out are moved to a first layer formed on a side on which the incident light impinges, a voltage which causes the electron multiplication to occur;
   the second drive signal taking, in a second interval which is continuous to the first interval and in which the signal charges read out are moved to a second layer separated from the first layer with a boundary layer intervening, the voltage which causes the electron multiplication to occur;

said method further comprising the step of adjusting a number of repetitions of the first interval and the second interval according to an amplification factor of the electron multiplication and applying the first and second drive signals.

6. The method in accordance with claim 4, further comprising:
- a first step of comparing an imaging sensitivity with a predetermined sensitivity threshold value to decide whether or not the imaging sensitivity is higher than the threshold value;
- a second step of setting, when in said first step the imaging sensitivity is higher than the threshold value, an applied voltage of the first drive signal higher than that of the second drive signal; and
- a third step of setting, when in said fist step the imaging sensitivity is not higher than the threshold value, the applied voltages of the first and second drive signals equal to each other.

7. The method in accordance with claim 5, further comprising:
- a first step of comparing an imaging sensitivity with a predetermined sensitivity threshold value to decide whether or not the imaging sensitivity is higher than the threshold value;
- a second step of setting, when in said first step the imaging sensitivity is higher than the threshold value, an applied voltage of the first drive signal higher than that of the second drive signal; and
- a third step of setting, when in said fist step the imaging sensitivity is not higher than the threshold value, the applied voltages of the first and second drive signals equal to each other.

8. The method in accordance with claim 4, further comprising:
- a first step of comparing an imaging sensitivity with a first sensitivity threshold value to decide whether or not the imaging sensitivity is higher than the first sensitivity threshold value;
- a second step of substantially maintaining, when in said first step the imaging sensitivity is not higher than the first sensitivity threshold value, a number of the signal charges;
- a third step of comparing, when in said first step the imaging sensitivity is higher than the first sensitivity threshold value, the imaging sensitivity with a second sensitivity threshold value to decide whether or not the imaging sensitivity is higher than the second sensitivity threshold value;
- a fourth step of causing, when in said third step the imaging sensitivity is not higher than the second sensitivity threshold value, the electron multiplication to occur; and
- a fifth step of setting, when in said third step the imaging sensitivity is higher than the second sensitivity threshold value, a number of occurrences of the electron multiplication greater than a number of occurrences in said fourth step.

9. The method in accordance with claim 5, further comprising:
- a first step of comparing an imaging sensitivity with a first sensitivity threshold value to decide whether or not the imaging sensitivity is higher than the first sensitivity threshold value;
- a second step of substantially maintaining, when in said first step the imaging sensitivity is not higher than the first sensitivity threshold value, a number of the signal charges;
- a third step of comparing, when in said first step the imaging sensitivity is higher than the first sensitivity threshold value, the imaging sensitivity with a second sensitivity threshold value to decide whether or not the imaging sensitivity is higher than the second sensitivity threshold value;
- a fourth step of causing, when in said third step the imaging sensitivity is not higher than the second sensitivity threshold value, the electron multiplication to occur; and
- a fifth step of setting, when in said third step the imaging sensitivity is higher than the second sensitivity threshold value, a number of occurrences of the electron multiplication greater than a number of occurrences in said fourth step.

* * * * *